(12) United States Patent
Liu et al.

(10) Patent No.: US 7,868,525 B2
(45) Date of Patent: Jan. 11, 2011

(54) LED ILLUMINATING DEVICE

(75) Inventors: Tay-Jian Liu, Taipei Hsien (TW); Na Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 29 days.

(21) Appl. No.: 12/468,864

(22) Filed: May 19, 2009

(65) Prior Publication Data

US 2010/0060132 A1 Mar. 11, 2010

(30) Foreign Application Priority Data

Sep. 11, 2008 (CN) .................... 2008 1 0304463

(51) Int. Cl.
*H01J 1/02* (2006.01)

(52) U.S. Cl. .......................... 313/25; 313/46

(58) Field of Classification Search .................. 313/25, 313/46

See application file for complete search history.

(56) References Cited

U.S. PATENT DOCUMENTS

2006/0193139 A1* 8/2006 Sun et al. .................... 362/373

* cited by examiner

*Primary Examiner*—Vip Patel
(74) *Attorney, Agent, or Firm*—Frank R. Niranjan

(57) ABSTRACT

An LED illuminating device includes an optical part having a light source therein, an electrical part and a heat dissipation part. The electrical part includes a rear shell and a circuit board electrically connecting with the light source. The heat dissipation part includes a hollow front shell having a rear end secured with the rear shell, a heat sink and a cooling fan arranged in the front shell. The front shell defines a plurality of first and second air holes. The heat sink includes a solid base and a plurality of fins. The light source is thermally connected with the base. An airflow produced by the cooling fan is introduced into the front shell via the first air holes. The airflow flows then towards the heat sink and finally flows out of the front shell via the second air holes.

20 Claims, 11 Drawing Sheets

LED ILLUMINATING DEVICE

BACKGROUND

1. Technical Field

The present disclosure generally relates to light emitting diode (LED) illuminating devices, and particularly to an LED illuminating device with a high heat dissipating efficiency.

2. Description of Related Art

In recent years, LEDs are preferred for use in illuminating devices rather than CCFLs (cold cathode fluorescent lamps) due to their excellent properties, including high brightness, long lifespan, wide color range, and etc.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illuminating device in order to obtain a desirable illumination brightness. Therefore, heat dissipation of the LED illuminating device is a problem inhibiting the application of the LED illuminating device, which requires to be resolved.

For a high brightness LED illuminating device, a highly efficient heat dissipation device is necessary in order to timely and adequately remove the heat generated by the LED illuminating device. Otherwise, the brightness, lifespan, and reliability of the LED illuminating device will be seriously affected. Conventional heat dissipation devices, such as heat sinks, can no longer satisfy the heat dissipation requirement of the high brightness LED illuminating device.

In order to enhance heat dissipation efficiency, air moving devices such as cooling fans are employed in combination with heat sinks to dissipate the heat of the high brightness LED illuminating device. The cooling fan generates an airflow which flows through the metal fins of the heat sink, to thereby dissipate the heat of the high brightness LED illuminating device. This kind of thermal design is suitable for a majority of LED illuminating devices, but is not suitable for some LED illuminating devices which have a critical heat dissipation requirement. It is believed that the heat dissipation efficiency of the conventional heat dissipation devices can be further improved.

For the foregoing reasons, therefore, there is a need in the art for an LED illuminating device which overcomes the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
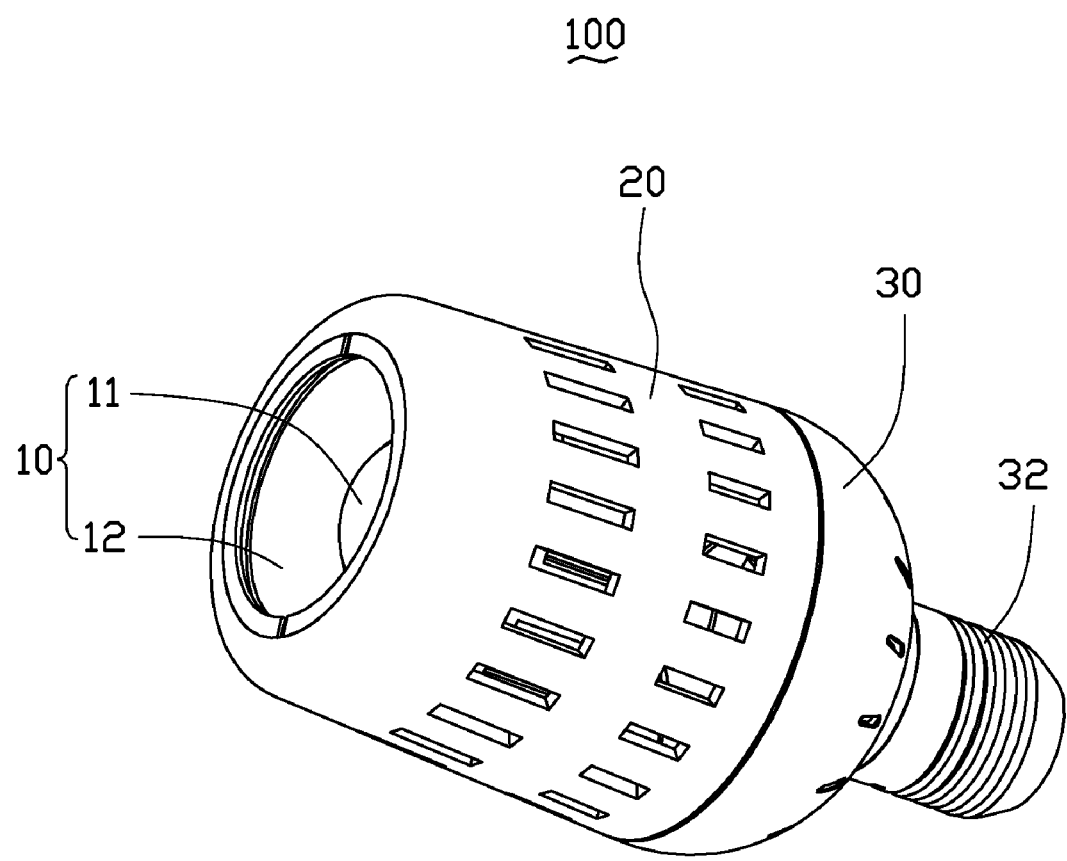
FIG. 1 is an assembled, isometric view of an LED illuminating device according to an exemplary embodiment.

Referring to FIG. 1, an LED illuminating device 100 according to an exemplary embodiment includes an optical part 10, an electrical part 30, and a heat dissipation part 20 arranged between the optical part 10 and the electrical part 30. The LED illuminating device 100 is substantially cylindrical. The optical part 10 is located at a front end of the LED illuminating device 100, while the electrical part 30 is located at a rear end of the LED illuminating device 100.

Figure 2:
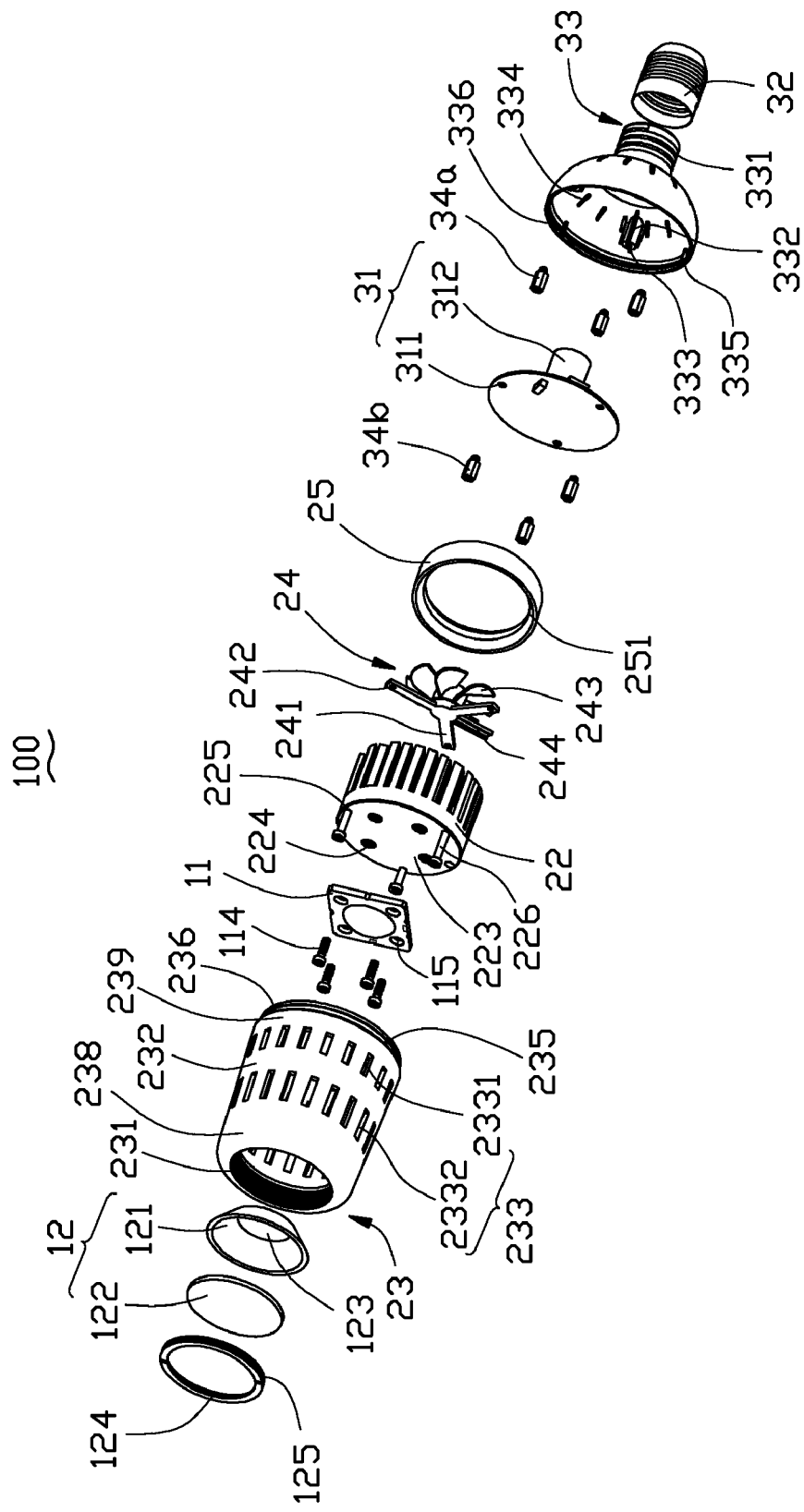
FIG. 2 is an exploded, isometric view of the LED illuminating device of FIG. 1.

Referring also to FIG. 2, the heat dissipation part 20 is provided with a front shell 23, a heat sink 22, a cooling fan 24 and an annular air guider 25. The front shell 23 is a hollow cylinder. The heat sink 22, the cooling fan 24 and the air guider 25 are arranged in the front shell 23.

The front shell 23 has a front end 238 and a rear end 239 coupled to the electrical part 30. An inner diameter of the front shell 23 is gradually increased from the front end 238 to the rear end 239. The front end 238 has an inner screw thread 231 formed on an inner surface thereof. The front shell 23 defines an air window 233 therein for allowing airflow flowing into and out of the front shell 23. The air window 233 includes a plurality of first air holes 2331 located adjacent to the rear end 239 and a plurality of second air holes 2332 located adjacent to the front end 238. The first and the second air holes 2331, 2332 are longitudinally extended in a circumferential surface of the front shell 23 and radially defined through the circumferential surface of the front shell 23. The front shell 23 has an annular middle partition ring 232 formed between the first and the second air holes 2331, 232 to separate the first and the second air holes 2331, 2332.

The heat sink 22 includes a solid base 221 and a plurality of fins 222 formed on the solid base 221. The solid base 221 has a heat absorbing surface 223 at a front side and a rear end surface 228 at a rear side. The fins 222 extend rearwards from the rear end surface 228 towards the electrical part 30. When the heat sink 22 is arranged in the front shell 23, the second air holes 2332 surround a portion of the solid base 221 and a large portion of the fins 222. The solid base 221 defines axially a plurality of through holes 225 therein. The through holes 225 extend through the heat absorbing surface 223 and the rear end surface 228 and are located adjacent to a circumferential edge of the solid base 221. A plurality of elongated bolts 226 are provided corresponding to the through holes 225 to fix the heat sink 22 in the front shell 23. Each of the elongated bolts 226 is received in a corresponding through hole 225.

The cooling fan 24 is provided between the heat sink 22 and the electrical part 30. The cooling fan 24 includes a bracket 241 having three ribs, a stator (not shown) mounted on the bracket 241, an impeller 243 rotatably mounted to the stator, and a wire guiding pole 244 located between the bracket 241 and the impeller 243. The wire guiding pole 244 is used for supporting and guiding wires of the cooling fan 24, thereby preventing the wires of the cooling fan 24 from disturbing the rotation of the cooling fan 24. A plurality of through holes 242 are defined in free ends of the ribs of the bracket 241 corresponding to the through holes 225 of the heat sink 22. The elongated bolts 226 extend through the through holes 242 to mount the cooling fan 24 on the heat sink 22. When the cooling fan 24 is arranged in the front shell 23, the cooling fan 24 is located corresponding to and surrounded by the middle partition ring 232 of the front shell 23.

The air guider 25 is located corresponding to the middle partition ring 232 of the front shell 23 and also surrounds the cooling fan 24. In other words, the cooling fan 24 the air guider 25 are aligned with the middle partition ring 232. The air guider 25 has an axial length substantially equal to that of the middle partition ring 232. An outer diameter of the air guider 25 is substantially equal to an inner diameter of the middle partition ring 232. Thus, the air guider 25 is conveniently attached to an inner surface of the middle partition ring 232. Two tapered guiding faces 251 are formed at front and rear ends of an inner surface of the air guider 25. Each tapered guiding face 251 has a diameter gradually decreased toward a middle of the air guider 25. In other words, an inner diameter of the air guider 25 has the smallest size at the middle of the air guider 25.

Figure 3:
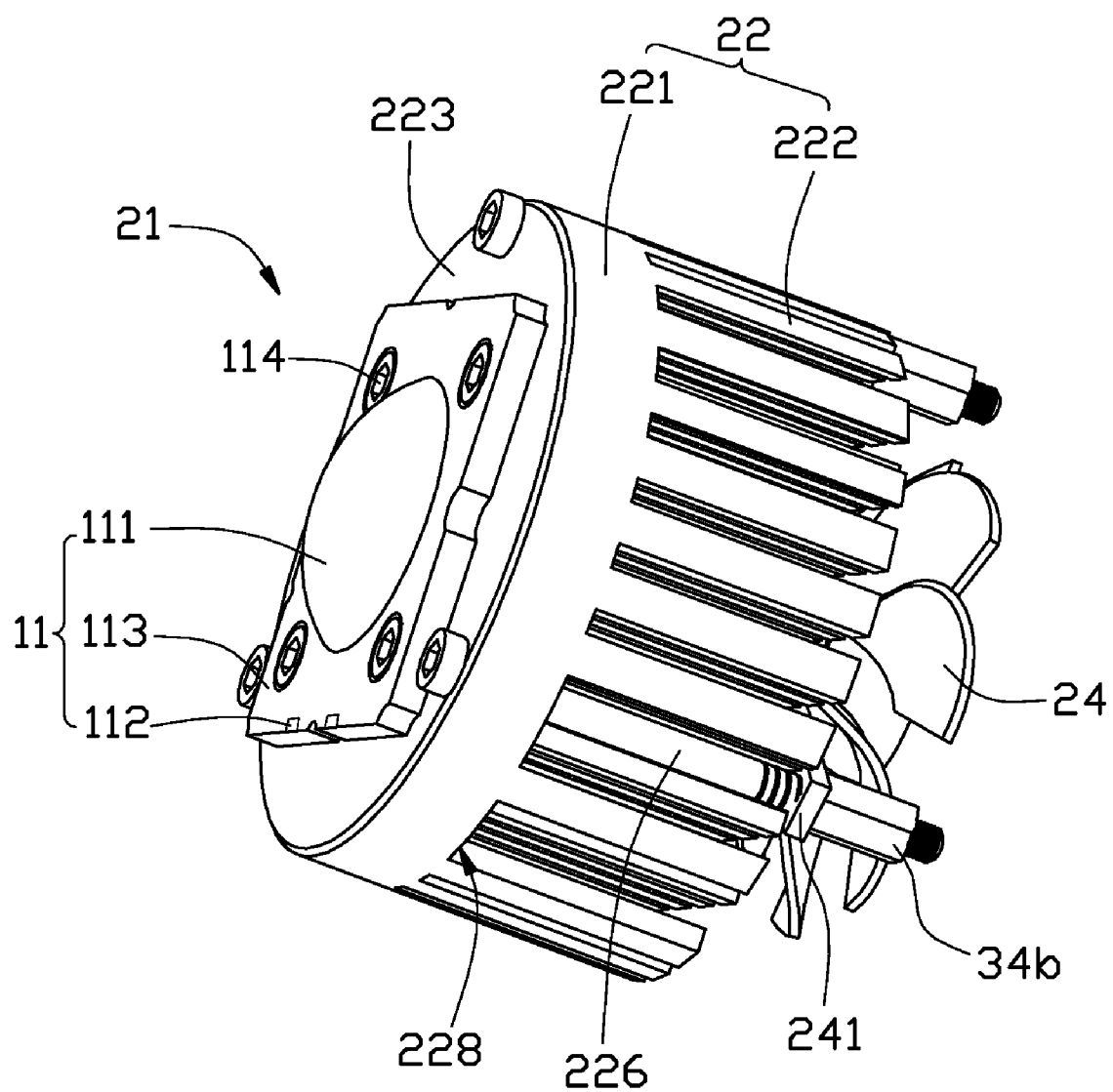
FIG. 3 is an assembled, isometric view of a light engine of the LED illuminating device of FIG. 2.

The optical part 10 is arranged in the front end 238 of the front shell 23. The optical part 10 includes at least one light source 11 mounted on the heat absorbing surface 223 of the solid base 221 of the heat sink 22, and a light emitting passage 12. Referring also to FIG. 3, the light source 11, the heat sink 22 and the cooling fan 24 cooperatively form a light engine 21 for the LED illuminating device 100. The light source 11 is thermally attached to the heat absorbing surface 223 of the solid base 221, whereby heat generated by the light source 11 is transferred to and effectively dissipated by the heat sink 22.

The light source 11 includes a substrate 113 forming electrical circuits thereon and at least one LED 111 (light emitting diode) electrically connected to the electrical circuits of the substrate 113. A plurality of through holes 115 are defined in the substrate 113 and located adjacent to a circumferential edge of the substrate 113. The solid base 221 defines a plurality of fixing holes 224 in the heat absorbing surface 223 corresponding to the through holes 115 of the substrate 113. A plurality of screws 114 are used to extend through the through holes 115 of the substrate 113 and threadedly engage into the fixing holes 224 of the solid base 221 to thereby securely attach the substrate 113 to the heat absorbing surface 223 of the solid base 221. A pair of electrodes 112 are provided on the substrate 113 for electrically connecting the LED 111 with electrical components of the electrical part 30. Alternatively, electrical circuits can be directly formed on the heat absorbing surface 223 of the solid base 221, and the LED 111 is directly attached to the electrical circuits of the heat absorbing surface 223 of the solid base 221, whereby the substrate 113 can be omitted and a heat resistance between the LED 111 and the solid base 221 is reduced.

The light emitting passage 12 includes a light reflector 121 and an optical lens 122 which are received in the front shell 23. The light reflector 121 has a configuration of a hollow, truncated cone, tapering from the front end 238 towards the rear end 239 of the front shell 23. The light reflector 121 has a rear end located adjacent to the heat sink 22, and a front end located away from the heat sink 22. A through hole 123 is defined in the light reflector 121 for extension of the light source 11 therein. The rear end of the light reflector 121 abuts the substrate 113 of the light source 11 and the LED 111 of the light source 11 is received in the through hole 123 of the light reflector 121. The optical lens 122 is attached to the front end of the light reflector 121. The light reflector 121 and the optical lens 122 provide luminescence characteristics for the light source 11 and protect the light source 11. Light emitted by the light source 11 is reflected and guided by the light reflector 121 to an outside of the front shell 23 through the optical lens 122. An annular fixing member 124 is provided in front of the optical lens 122. The fixing member 124 forms an outer screw thread 125 on an outer circumferential surface thereof corresponding to the inner screw thread 231 of the front shell 23. The fixing member 124 threadedly engages into the front end 238 of the front shell 23 to thereby securely attach the optical lens 122 and the light reflector 121 in the front end 238 of the front shell 23.

The electrical part 30 provides drive power, control circuit and power management for the light source 11. The electrical part 30 includes a cup-shaped rear shell 33 connected to the front shell 23, and a circuit board 31 received in the rear shell 33. The rear shell 33 has an open front end connected with the rear end 239 of the front shell 23, and a rear screw base 331 electrically connected with a power socket 32. The circuit board 31 electrically connects with the electrodes 112 of the light source 11 and the screw base 331 via electrical wires (not shown), whereby the LED illuminating device 100 can get power from an external power source via the power socket 32.

A plurality of air passage apertures 334 are radially defined through the rear shell 33 at a position adjacent to the screw base 331. The air passage apertures 334 communicate an interior of the rear shell 33 with an environment and are utilized for dissipating heat generated by electrical components 312 of the circuit board 31. The circuit board 31 defines a plurality of through holes 311 corresponding to the through holes 225 of the heat sink 22. The rear shell 33 forms a plurality of mounting pins 332 on an inner surface thereof corresponding to the through holes 311 of the circuit board 31. Each of the mounting pins 332 defines a fixing hole 333 at a free end thereof. A plurality of first connecting pillars 34a are provided between the circuit board 31 and the mounting pins 332 of the rear shell 33, and a plurality of second connecting pillars 34b are provided between the circuit board 31 and the cooling fan 24. Each of the first and the second connecting pillars 34a, 34b is located corresponding to one of the through holes 311 of the circuit board 31, and forms an outer screw thread 341 (referring to FIG. 4) on an outer surface of a rear end thereof and defines a fixing hole 342 (referring to FIG. 4) in a front end thereof. The fixing hole 342 forms an inner screw thread on an inner surface thereof.

In assembly, rear ends of the first connecting pillars 34a threadedly engage into the fixing holes 333 of the mounting pins 332 of the rear shell 33. Rear ends of the second connecting pillars 34b extend through the through holes 311 of the circuit board 31 and threadedly engage into the front ends of the first connecting pillars 34a, thereby sandwiching the circuit board 31 between the first and the second connecting pillars 34a, 34b. The elongated bolts 226 successively extend through the through holes 225 of the heat sink 22, the through holes 242 of the cooling fan 24, and then threadedly engage into front ends of the second connecting pillars 34b, thereby fixing the light engine 21, the circuit board 31 and the rear shell 33 together.

In order to connect the front and the rear shells 23, 33 together, a first positioning structure 235 and a first clasping structure 236 are formed at the rear end 239 of the front shell 23, and a second positioning structure 335 and a second clasping structure 336 are formed at the front end of the rear shell 33. The front and the rear shells 23, 33 are assembled together via an engagement between the first and the second positioning structures 235, 335 and an engagement between the first and the second clasping structures 236, 336, which prevents the front and the rear shells 23, 33 from separating from each other along an axial direction of the LED illuminating device 100 and rotating relative to each other. The first and the second positioning structures 235, 335 and the first and the second clasping structures 236, 336 have configurations which complement with each other. The first positioning structure 235 includes a plurality of grooves axially defined in an outer surface of the rear end 239 of the front shell 23, whilst the second positioning structure 335 includes a plurality of protrusions axially formed on the inner surface of the front end of the rear shell 33. Each of the protrusions is fitted in a corresponding groove. The first clasping structure 236 includes an annular protrusion formed on the outer surface of the rear end 239 of the front shell 23, whilst the second clasping structure 336 includes an annular groove defines in the inner surface of the front end of the rear shell 33. The annular protrusion is fitted in the annular groove.

In operation of the LED illuminating device 100, heat generated by the light source 11 is transferred to the heat sink 22. Airflow produced by the cooling fan 24 is introduced into the front shell 23 via a rear side of the air window 233 (i.e., via the first air holes 2331). The airflow flows towards the heat sink 22 and then flows out of the front shell 23 via a front side of the air window 233 (i.e., via the second air holes 2332). Thus, a forced air convection is circulated between the ambient atmosphere and an interior of the LED illuminating device 100 to continuously dissipate the heat generated by the light source 11.

Generally, a small amount of the airflow of the cooling fan 24 flows towards a center portion of the heat sink 22 due to the existence of the hub of the impeller 243. In order to enhance a heat dissipation efficiency of the cooling fan 24, the air guider 25 is provided in the front shell 23 to guide the airflow produced by the cooling fan 24. When the airflow produced by the cooling fan 24 flows through the air guider 25, the tapered guiding face 251 at the rear end of the air guider 25 forces the airflow to gradually accelerate and gather towards the center portion of the heat sink 22 which is the hottest portion of the heat sink 22, to thereby increase a utilization ratio of the airflow. After exchanging heat energy with the heat sink 22, the airflow is gradually decelerate by the tapered guiding face 251 at the front end of the air guider 25, and then exhausted out of the front shell 23 via the second air holes 2332. The air guider 25 further prevents the ambient atmosphere inhaled into the front shell 23 via the first air holes 2331 from flowing immediately out of the front shell 23 via the second air holes 2332, without exchanging heat adequately with the heat sink 22.

Alternatively, the cooling fan 24 can be configured so that the ambient air is inhaled into the front shell 23 via the front side of the air window 233 (i.e., via the second air holes 2332) and flows through the fins 222 of the heat sink 22; finally, the airflow produced by the cooling fan 24 is exhausted out of the front shell 23 via the rear side of the air window 233 (i.e., via the first air holes 2331).

Figure 4:
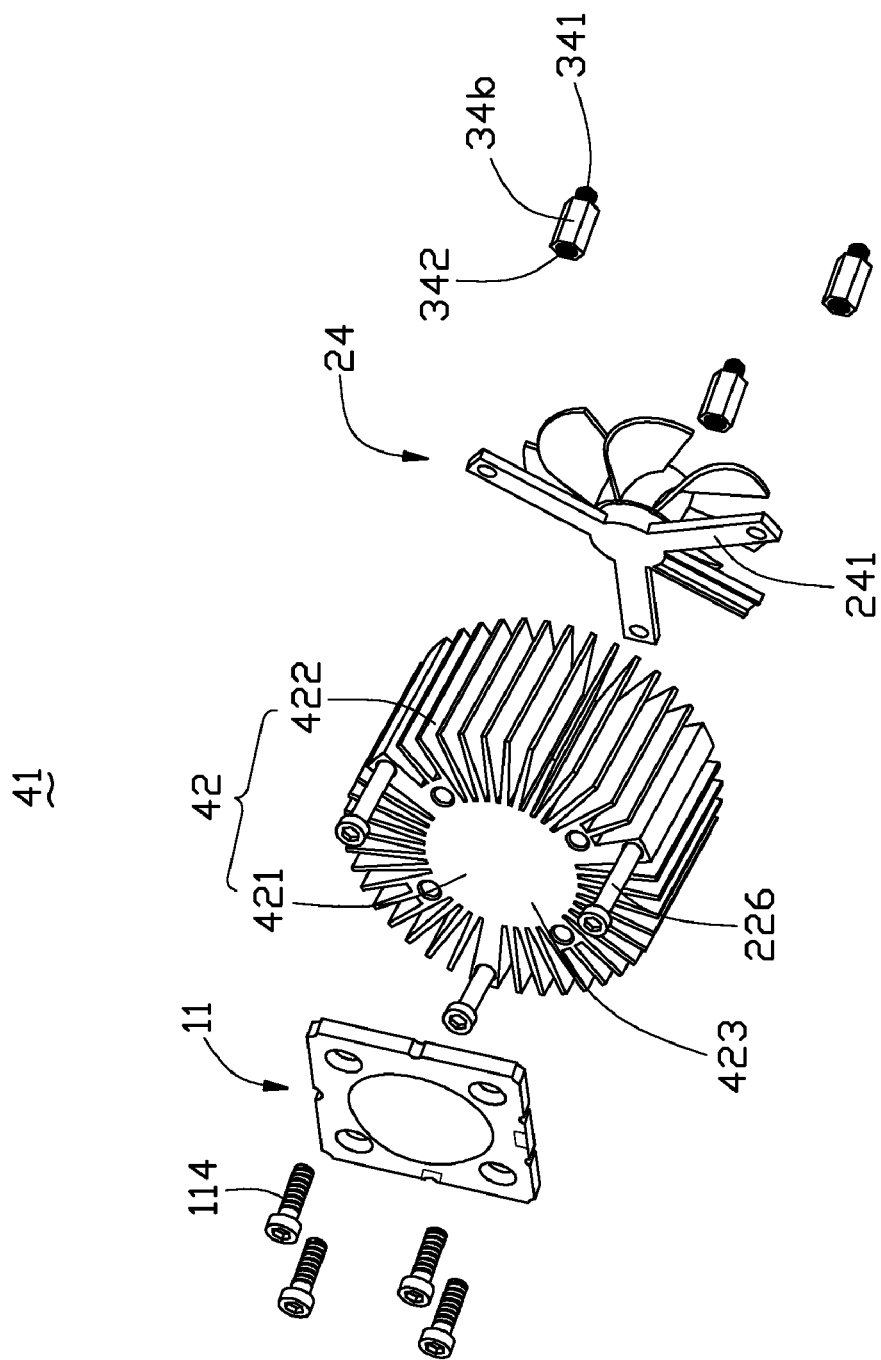
FIG. 4 is an exploded, isometric view of a light engine in accordance with an alternative embodiment.
Figure 5:
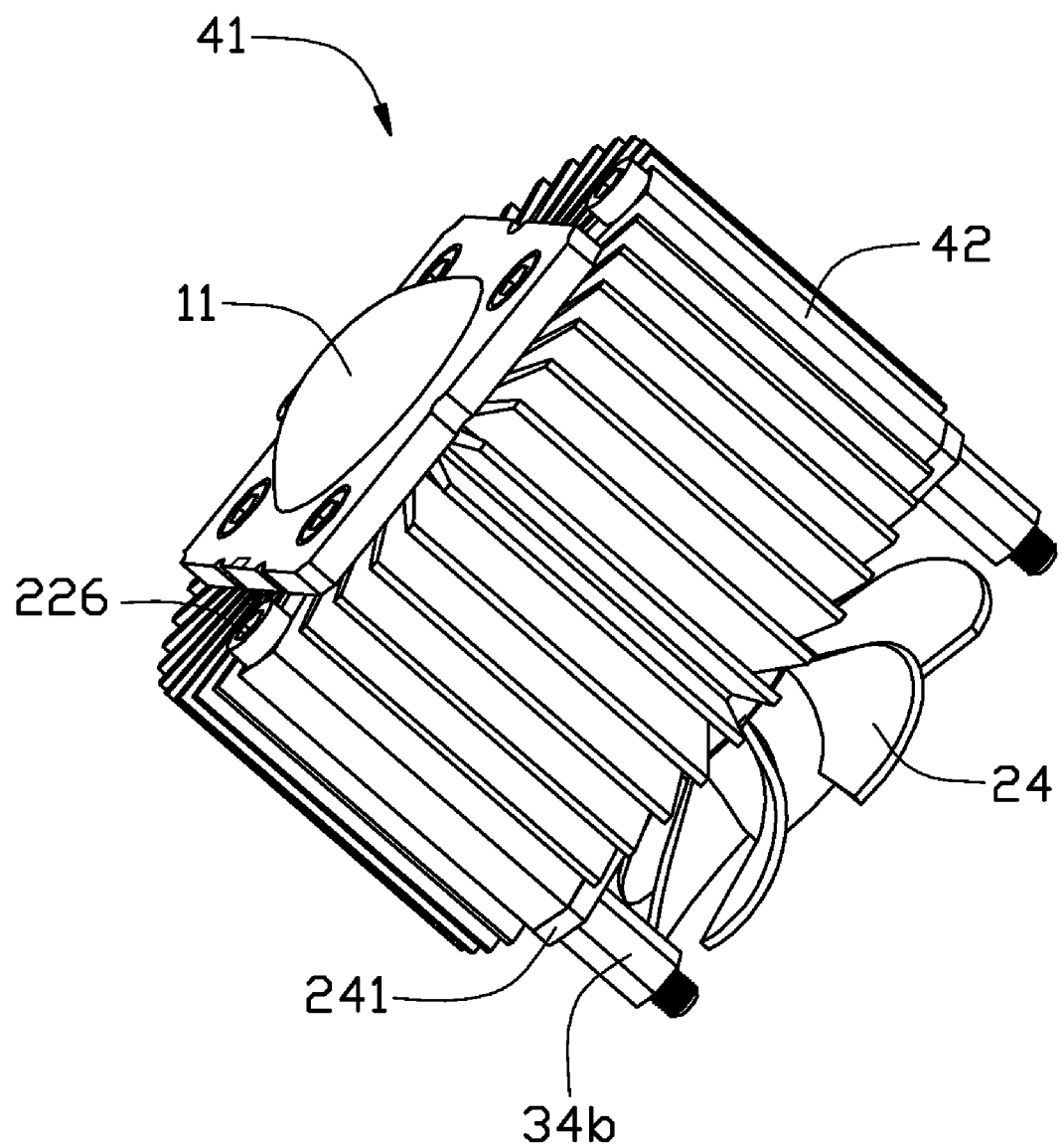
FIG. 5 is an assembled, isometric view of the light engine of FIG. 4.

FIGS. 4-5 shows an alternative light engine 41 including the light source 11, the cooling fan 24 and a heat sink 42. The heat sink 42 includes a column-shaped solid base 421 and a plurality of fins 422 formed on the solid base 421. The fins 422 extend radially from a circumferential surface of the solid base 421. The solid base 421 has a heat absorbing surface 423 at a front side. The light source 11 is mounted on the heat absorbing surface 423 by the screws 114. The bracket 241 of the cooling fan 24 is mounted on a rear side of the heat sink 42 by the elongated bolts 226 and the second connecting pillars 34*b*.

Figure 6:
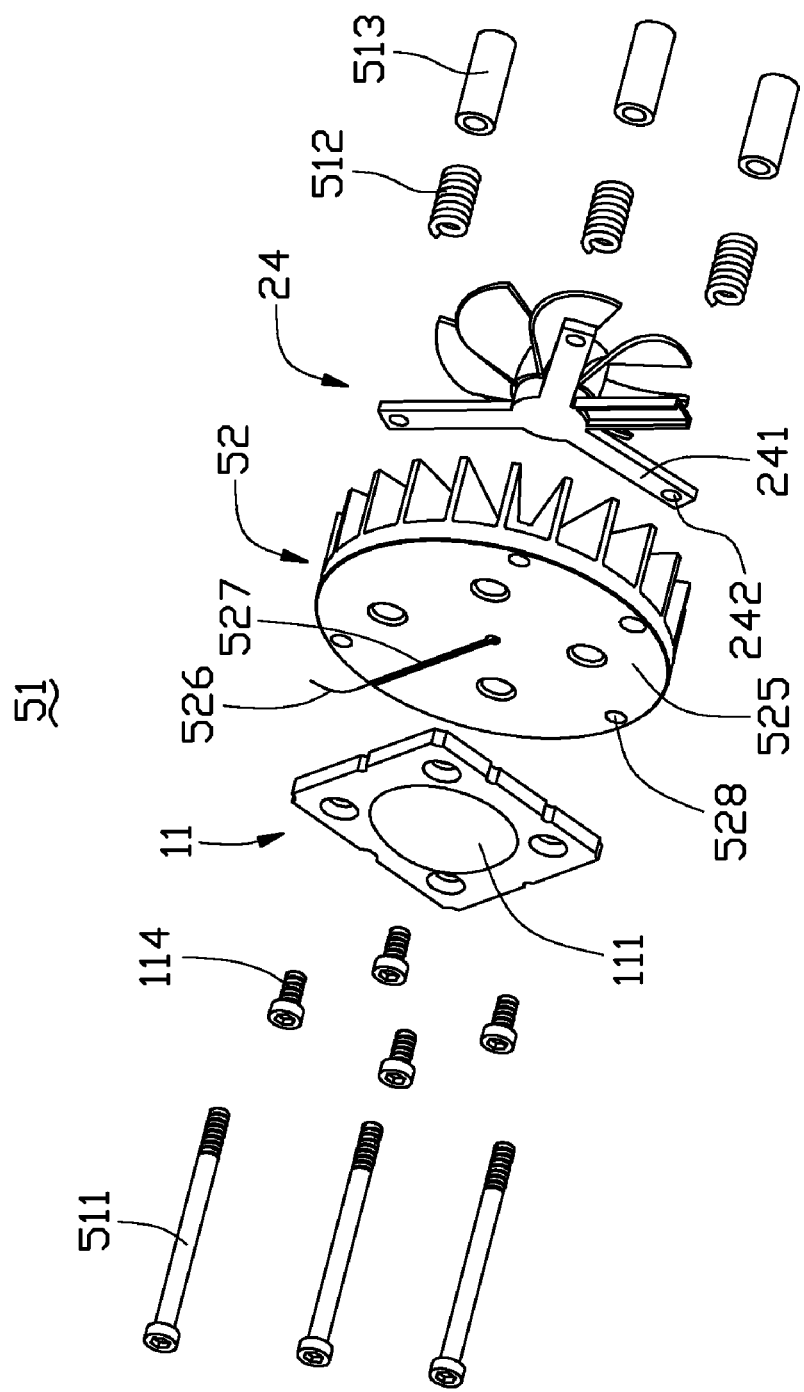
FIG. 6 is an exploded, isometric view of a light engine in accordance with a further alternative embodiment.
Figure 7:
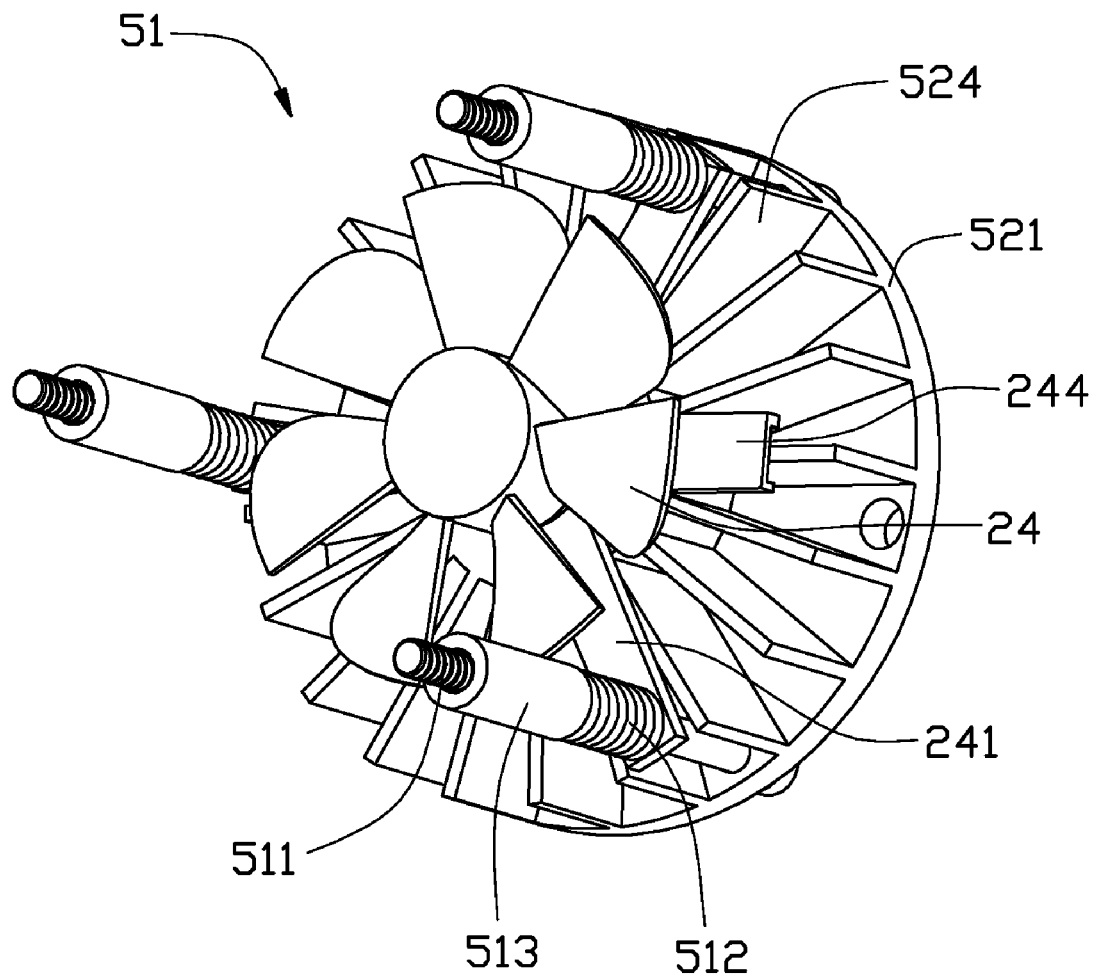
FIG. 7 is an assembled, isometric view of the light engine of FIG. 6.
Figure 8:
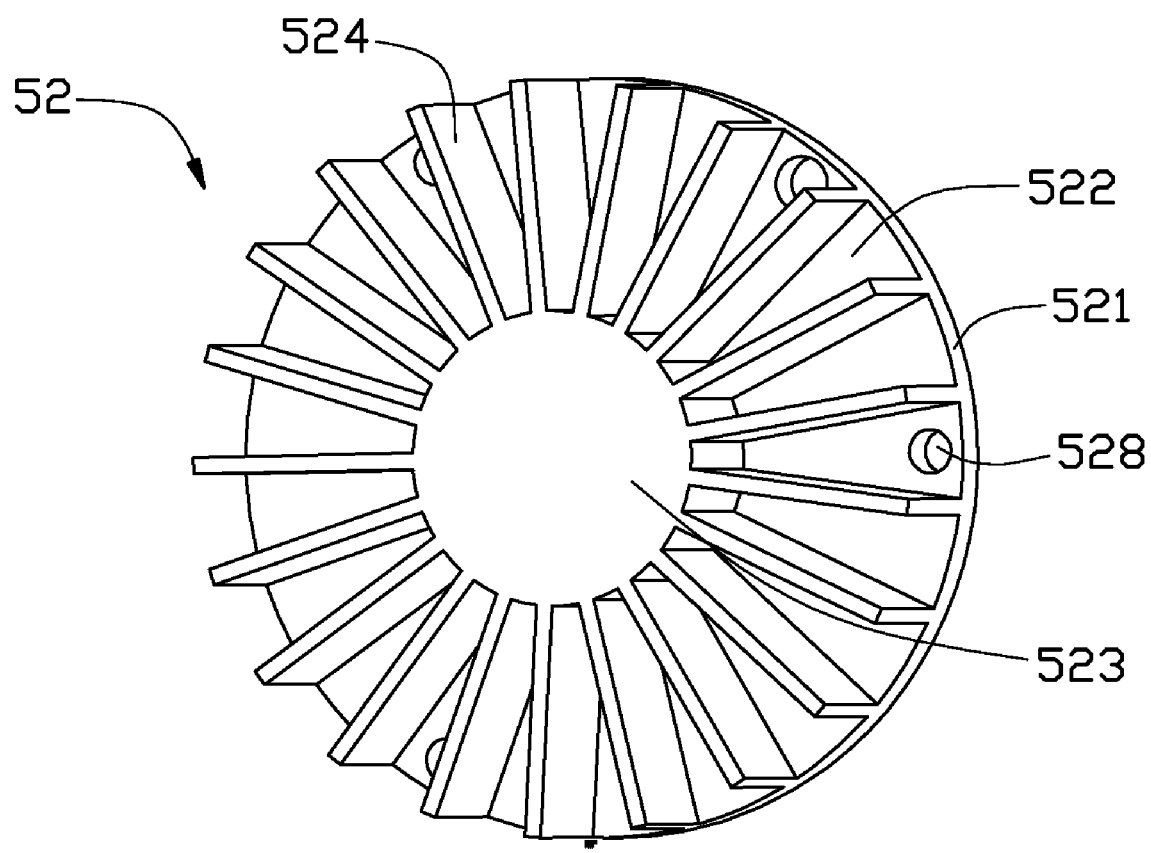
FIG. 8 is an isometric view of a heat sink of the light engine of FIG. 6.

FIGS. 6-7 shows a further alternative light engine 51 including the light source 11, the cooling fan 24 and a heat sink 52. Referring also to FIG. 8, the heat sink 52 includes a solid base 521, a center column 523 and a plurality of fins 524 formed on the solid base 521. The solid base 521 has a heat absorbing surface 525 at a front side and a rear end surface 522 at a rear side. The center column 523 extends rearwards from a center portion of the rear end surface 523 towards the cooling fan 24. The fins 524 extend radially from a circumferential surface of the center column 523 and front ends of the fins 524 connect with the rear end surface 522 of the solid base 521. The solid base 521 defines axially a plurality of through holes 528 therein corresponding to the through holes 242 of the bracket 241 of the cooling fan 24. The through holes 528 extend through the heat absorbing surface 525 and the rear end surface 522 and are located adjacent to a circumferential edge of the solid base 521.

The light source 11 is mounted on the heat absorbing surface 525 by the screws 114. The heat sink 52 and the cooling fan 24 are mounted together by a plurality of elongated bolts 511, a plurality of springs 512 and a plurality of sleeves 513. In this embodiment, the springs 512 and the sleeves 513 replace the second connecting pillars 34*b* of the previous embodiment shown in FIGS. 1-2. Each of the elongated bolts 511 extends successively through a corresponding through hole 528 of the heat sink 52, a corresponding through hole 242 of the cooling fan 24, a corresponding spring 512 and a corresponding sleeve 513, a corresponding through hole 311 of the circuit board 31, and then threadedly engages into a front end of a corresponding first connecting pillar 34*a*. The circuit board 31 is sandwiched between the sleeves 513 and the first connecting pillars 34*a*.

Further, a receiving groove 527 is defined in the heat absorbing surface 525 for receiving a temperature measuring sensor 526 therein. The temperature measuring sensor 526 is electrically connected to an overheat protection circuit of the circuit board 31. The overheat protection circuit can immediately cut off the power supply of the LED 111 to protect the LED 111 when a junction temperature of the LED 111 reaches a specified temperature value after the LED 111 has worked for an extended period of time.

Figure 9:
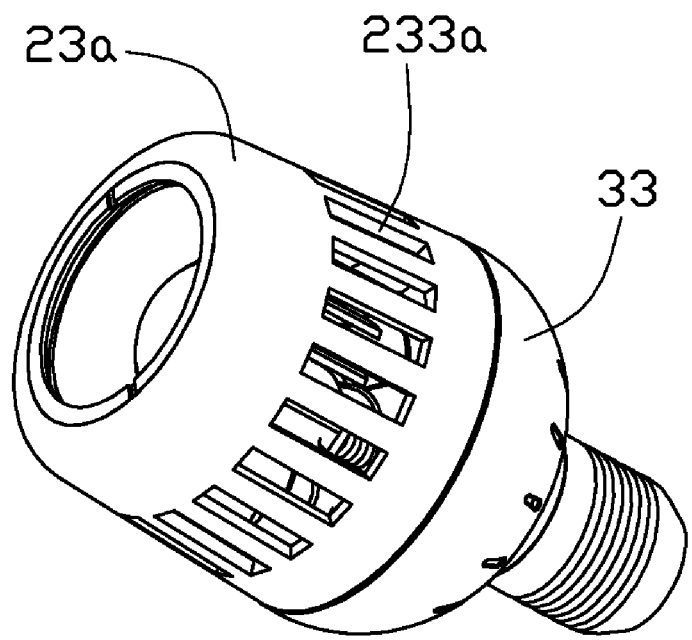
FIG. 9 is an assembled, isometric view of an LED illuminating device according to another exemplary embodiment.
Figure 10:
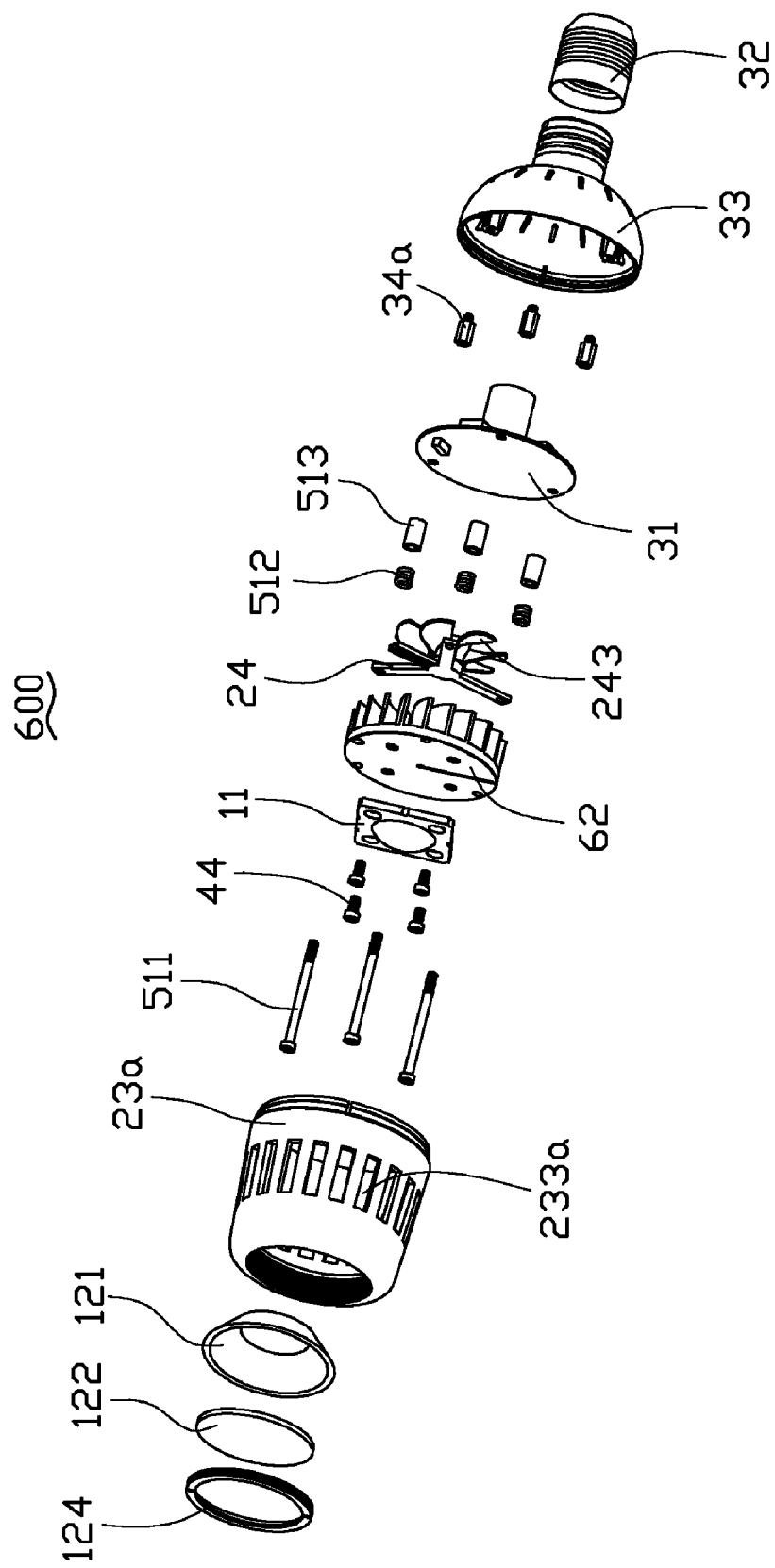
FIG. 10 is an exploded, isometric view of the LED illuminating device of FIG. 9.
Figure 11:
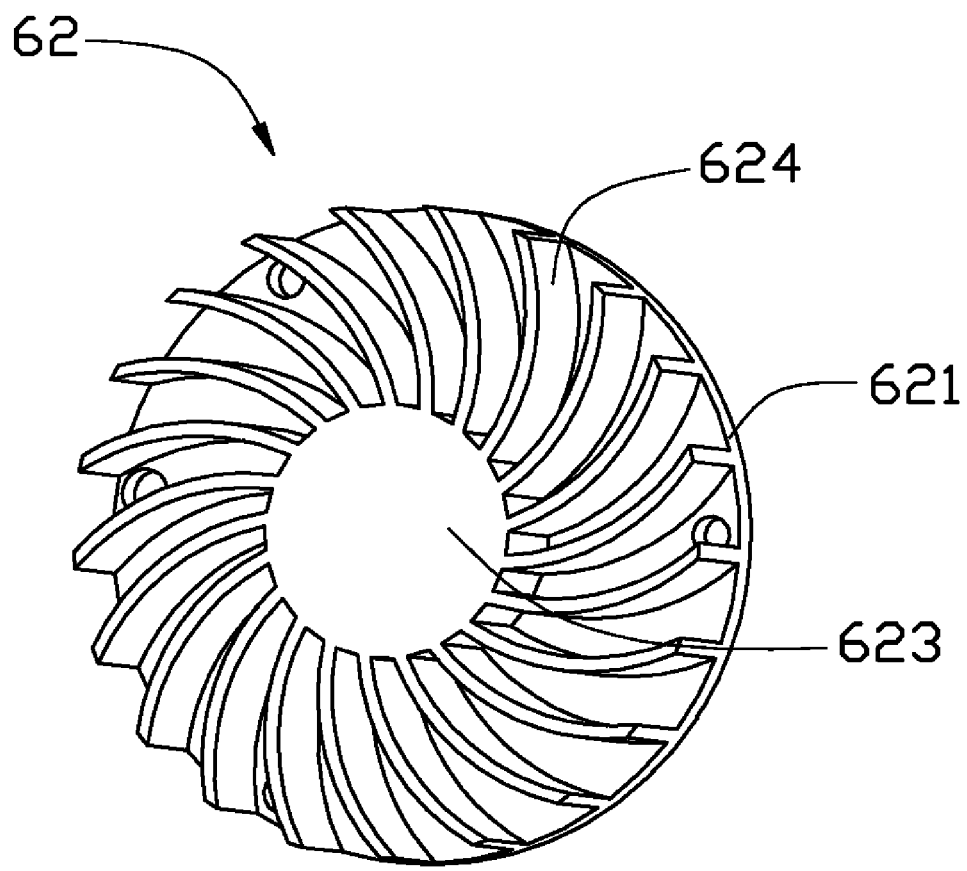
FIG. 11 is an isometric view of a heat sink of the LED illuminating device of FIG. 10.

Referring to FIGS. 9-10, an LED illuminating device 600 according to an alternative embodiment is illustrated. Except the following differences, the LED illuminating device 600 of the present embodiment is essentially the same as the LED illuminating device 100 of the first embodiment. In the present embodiment, the LED illuminating device 600 is provided with a front shell 23*a* and a heat sink 62. The front shell 23*a* defines an air window therein for allowing airflow flowing into and out of the front shell 23*a*. The air window includes a plurality of axially elongated air holes 233*a* defined radially through a circumferential surface of the front shell 23*a*. Each of the elongated air holes 233*a* is formed by cutting the middle partition ring 232 to connect a first air hole 2331 with a corresponding second air hole 2332 of the front shell 23 of the first embodiment shown in FIG. 2. Each of the elongated air holes 233*a* extends along the axial direction of the front shell 23*a* and has a width greater than that of the first air hole 2331 and the second air hole 2332 of the first embodiment shown in FIG. 2. Referring also to FIG. 11, the heat sink 62 includes a solid base 621, a center column 623 and a plurality of curved fins 624 formed on a rear end surface of the solid base 621 facing the cooling fan 24. The center column 623 extends rearwards from a center portion of the rear end surface of the solid base 621. The curved fins 624 extend radially from a circumferential surface of the center column 623 and are curved along an anticlockwise direction as viewed from a rear side of the heat sink 62. Alternatively, the curved fins 624 can be curved along a clockwise direction. When the cooling fan 24 operates, a rotation direction of the impeller 243 of the cooling fan 24 is the same as the curved direction of the curved fins 624 to improve the heat dissipating efficiency. Airflow produced by the cooling fan 24 is introduced into the front shell 23a via a rear side of the air window (i.e., via a rear side of the elongated air holes 233a adjacent to the circuit board 31). The airflow flows towards the heat sink 62 and then flows out of the front shell 23a via a front side of the air window (i.e., via a front side of the elongated air holes 233a adjacent to the light source 11). Further, the heat sink 62 and the cooling fan 24 are mounted together by the elongated bolts 511, the springs 512 and sleeves 513.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED illuminating device, comprising:
    an optical part comprising a light source therein;
    an electrical part comprising a rear shell and a circuit board received in the rear shell, the circuit board electrically connecting with the light source; and
    a heat dissipation part located between the optical part and the electrical part, the heat dissipation part comprising:
        a hollow front shell having a rear end and a front end opposite to the rear end, the rear end connected to the rear shell, the optical part being arranged in the front end of the front shell, the front shell comprising a circumferential surface defining a plurality of first air holes and a plurality of second air holes therethrough for allowing airflow flowing into and out of the front shell;
        a heat sink arranged in the front shell and located adjacent to the optical part, the heat sink comprising a solid base and a plurality of fins formed on the solid base; the solid base having a heat absorbing surface adjacent to the optical part, the light source being thermally connected with the heat absorbing surface of the solid base; and
        a cooling fan arranged in the front shell and located between the electrical part and the heat sink, an airflow produced by the cooling fan being introduced into the front shell via the first air holes, the airflow then flowing towards the heat sink and finally flowing out of the front shell via the second air holes.

2. The LED illuminating device of claim 1, further comprising an annular air guider arranged in the front shell and surrounding the cooling fan.

3. The LED illuminating device of claim 2, wherein two tapered guiding faces are formed at front and rear ends of an inner surface of the air guider, each guiding face having an inner diameter gradually decreasing toward a middle of the air guider.

4. The LED illuminating device of claim 1, wherein the first air holes are located adjacent to the rear end of the front shell and the second air holes are located adjacent to the front end of the front shell, the first and the second air holes being longitudinally extended in the circumference surface of the front shell and separated from each other by an annular middle partition ring of the front shell.

5. The LED illuminating device of claim 4, wherein the cooling fan and the air guider are received in the front shell and aligned with the middle partition ring.

6. The LED illuminating device of claim 1, wherein each of the first air holes is connected with a corresponding second air hole to form a single elongated air hole along an axial direction of the front shell.

7. The LED illuminating device of claim 1, wherein the front shell is substantially cylindrical, an inner diameter of the front shell being gradually increased from the front end to the rear end of the front shell.

8. The LED illuminating device of claim 1, wherein the solid base of the heat sink further has a rear end surface facing the electrical part, the fins extending rearwards from the rear end surface towards the electrical part.

9. The LED illuminating device of claim 1, wherein the solid base is column-shaped and the fins extend radially from a circumferential surface of the solid base.

10. The LED illuminating device of claim 1, wherein the heat sink further comprises a center column, the solid base further has a rear end surface facing the electrical part, the center column extending rearwards from a center portion of the rear end surface of the solid base towards the electrical part, the fins extending radially from a circumferential surface of the center column and front ends of the fins connect with the rear end surface of the solid base.

11. The LED illuminating device of claim 10, wherein the fins are curved along one of the clockwise direction and anticlockwise direction.

12. The LED illuminating device of claim 1, wherein the front shell forms a first positioning structure and a first clasping structure at the rear end thereof, the rear shell forming a second positioning structure and a second clasping structure at a front end thereof, the front and the rear shells being assembled together via an engagement between the first and the second positioning structures and an engagement between the first and the second clasping structures.

13. The LED illuminating device of claim 1, further comprising a plurality of the elongated bolts, a plurality of first connecting pillars and a plurality of second connecting pillars, the cooling fan having a bracket, the rear shell forming a plurality of mounting pins on an inner surface thereof, the first connecting pillars being located between the circuit board and the mounting pins, the second connecting pillars being located between the bracket of the cooling fan and the circuit board, wherein the heat sink, the cooling fan, the circuit board and the rear shell are fixed together by the elongated bolts, the first and the second pillars, and the mounting pins.

14. The LED illuminating device of claim 1, further comprising a plurality of the elongated bolts, a plurality of springs, a plurality of sleeves and a plurality connecting pillars, the cooling fan having a bracket, the rear shell forming a plurality of mounting pins on an inner surface thereof, the connecting pillars being located between the circuit board and the mounting pins, the springs and the sleeves being located between the bracket of the cooling fan and the circuit board, the circuit board being sandwiched between the sleeves and the first connecting pillars, wherein the heat sink, the cooling fan, the circuit board and the rear shell are fixed together by the elongated bolts, the springs, the sleeves, the connecting pillars and the mounting pins.

15. The LED illuminating device of claim 1, wherein the rear shell is cup-shaped, a plurality of air passage apertures being provided at a rear end of the rear shell for dissipating heat of the circuit board.

16. An LED illuminating device, comprising:

a barrel-shaped first shell comprising a front end, a rear end opposite to the front end, and a cylindrical surface sandwiched between the front end and the rear end, the cylindrical surface defining a plurality of first air holes arranged along a first circumference of the cylindrical surface and a plurality of second air holes arranged along a second circumference of the cylindrical surface;

an optical part received in the first shell adjacent to the front end, the optical part comprising a light source;

a heat sink received in the first shell adjacent to the optical part, the heat sink comprising a solid base and a plurality of fins, the solid base comprising a heat absorbing surface and an opposite rear surface, the light source thermally connected with the heat absorbing surface, the plurality of fins formed on the rear surface;

a cooling fan received in the first shell adjacent to the plurality of fins near the rear end, an airflow produced by the cooling fan being introduced into the first shell via the first air holes, the airflow then flowing towards the heat sink and finally flowing out of the first shell via the second air holes;

a cup-shaped second shell comprising an open end and an opposite screw terminal, the open end engaged with the rear end of the first shell, the screw terminal electrically connected with an external power socket; and a circuit board received in the second shell adjacent to the cooling fan, the circuit board configured for obtaining power from an external power source via the external power socket and providing drive power, control circuit and power management for the light source.

17. The LED illuminating device of claim 16, further comprising an annular air guider arranged in the first shell, the annular air guider sandwiched between the first air holes and the second air holes and surrounding the cooling fan.

18. The LED illuminating device of claim 16, wherein the first air holes and the second air holes are separated by an annular middle partition ring of the first shell.

19. The LED illuminating device of claim 16, wherein the optical part further comprises a light reflector and an optical lens received in the first shell, the light reflector is configured like a truncated cone and surrounding the light source, one end of the light reflector adjacent to the light source is attached to the heat absorbing surface, the other end of the light reflector is covered by the optical lens.

20. The LED illuminating device of claim 16, wherein a plurality of air passage apertures are provided at the second shell for dissipating heat of the circuit board.

\* \* \* \* \*